US006041035A

United States Patent [19]

Thedens

[11] Patent Number: 6,041,035

[45] Date of Patent: Mar. 21, 2000

[54] OPEN SYSTEM MODULAR ELECTRONICS ARCHITECTURE

[75] Inventor: John R. Thedens, Central City, Iowa

[73] Assignee: Rockwell Collins, Inc., Cedar Rapids, Iowa

[21] Appl. No.: 08/885,482

[22] Filed: Jun. 30, 1997

[51] Int. Cl.[7] .......................... G01R 31/08; G06F 11/00; G08C 15/00; H01H 67/00

[52] U.S. Cl. .......................... 370/217; 370/217; 370/221; 370/222; 370/225; 340/825.03; 340/825.06; 340/827

[58] Field of Search .................................... 370/217, 225; 701/1, 3, 14; 706/905; 340/827, 825.03, 825.22, 825.06, 825.16; 342/176, 42; 455/74

[56] References Cited

U.S. PATENT DOCUMENTS

| | | | |
|---|---|---|---|
| 4,387,334 | 6/1983 | Loper | 320/44 |
| 4,658,359 | 4/1987 | Palatucci et al. | 701/14 |
| 4,682,123 | 7/1987 | Loper et al. | 332/16 R |
| 5,095,533 | 3/1992 | Loper et al. | 455/245 |
| 5,179,730 | 1/1993 | Loper | 455/266 |
| 5,230,099 | 7/1993 | Loper | 455/324 |
| 5,249,203 | 9/1993 | Loper | 375/97 |
| 5,313,456 | 5/1994 | Sugawara | 340/827 X |
| 5,339,040 | 8/1994 | Loper | 329/358 |
| 5,509,536 | 4/1996 | Loper | 455/324 |
| 5,712,628 | 1/1998 | Phillips et al. | 342/42 X |

*Primary Examiner*—Michael Horabik
*Assistant Examiner*—Man Phan
*Attorney, Agent, or Firm*—Kyle Eppele; James P. O'Shaughnessy

[57] ABSTRACT

A communications, navigation and identification (CNI) avionics system is disclosed. The CNI system includes a first integrated sensor performing a first CNI function and a second integrated sensor performing a second CNI function of a lower priority than the first CNI function. A first communication path is assigned to the first integrated sensor such that it carries signals between the first integrated sensor and a first system asset. A second communication path is assigned to the second integrated sensor such that it carries signals between the second integrated sensor and a second system asset. Each of the first and second communication paths includes a common first interconnect coupled to both of the first and second integrated sensors, a common second interconnect coupled to each of the first and second system assets, and a separate cryptographic processor. A resource management controller reassigns the second communication path to the first integrated sensor in the event of a failure of the first communication path so that the higher priority CNI function is maintained.

15 Claims, 4 Drawing Sheets

OPEN SYSTEM MODULAR ELECTRONICS ARCHITECTURE

BACKGROUND OF THE INVENTION

The present invention relates generally to aviation electronics (avionics) systems. More particularly, the present invention relates to a modular communications, navigation and identification (CNI) system having an architecture which allows modules and/or communication pathways to be reconfigured in the event of a partial system failure.

CNI avionics systems integrate a number of functional modules (also known as assets) for use in performing various essential functions. Integrated sensor subsystems which transmit and receive data in various tailored formats for specific functions typically include sensor modules such as a receiver/exciter, an antenna and an antenna interface. Each of these integrated sensor subsystems is used to perform a different function such as VHF radio communications, UHF radio communications, data link communications for processing information about a nearby airport which is needed for use by the avionics systems, transponder functions and integrated landing system (ILS) functions. These integrated sensor subsystems communicate, through cryptographic processors, with other modules, computer systems and/or human interfaces. Typically, for security reasons, it is preferred to maintain data used by the CNI system computers or human machine interfaces (sometimes referred to as red data) separate from data used by the integrated sensor subsystems (sometimes referred to as black data). For this reason, the cryptographic processors encode and decode information communicated between the integrated sensor subsystems and the other modules or subsystems of the CNI avionics system.

Typically, a communication link between a particular integrated sensor subsystem and a computer system or human interface module is hard wired through a particular cryptographic processor to define a communications path (also known as a thread). Thus, if the communication path between a particular integrated sensor subsystem and another module stops functioning properly, for instance due to the malfunction of the associated cryptographic processor, the functions performed by the particular integrated sensor subsystem cannot be performed until maintenance on the CNI avionics system is available. This is an undesirable result because of the fact that higher priority integrated sensor subsystem functions may be lost while lower priority integrated sensor subsystem functions are still available.

SUMMARY OF THE INVENTION

A communications, navigation and identification (CNI) avionics system is disclosed. The CNI system includes a first integrated sensor subsystem performing a first CNI function and a second integrated sensor subsystems performing a second CNI function of a lower priority than the first CNI function. A first communication path is assigned to the first integrated sensor subsystem such that it carries signals between the first integrated sensor subsystem and a first system asset. A second communication path is assigned to the second integrated sensor subsystem such that it carries signals between the second integrated sensor subsystem and a second system asset. Each of the first and second communication paths includes a common first interconnect coupled to both of the first and second integrated sensor subsystems, a common second interconnect coupled to each of the first and second system assets, and a separate cryptographic processor. A resource management controller reassigns the second communication path to the first integrated sensor subsystem in the event of a failure of the first communication path so that the higher priority CNI function is maintained.

DETAILED DESCRIPTION OF THE PREFERRED EMBODIMENTS

Figure 1:
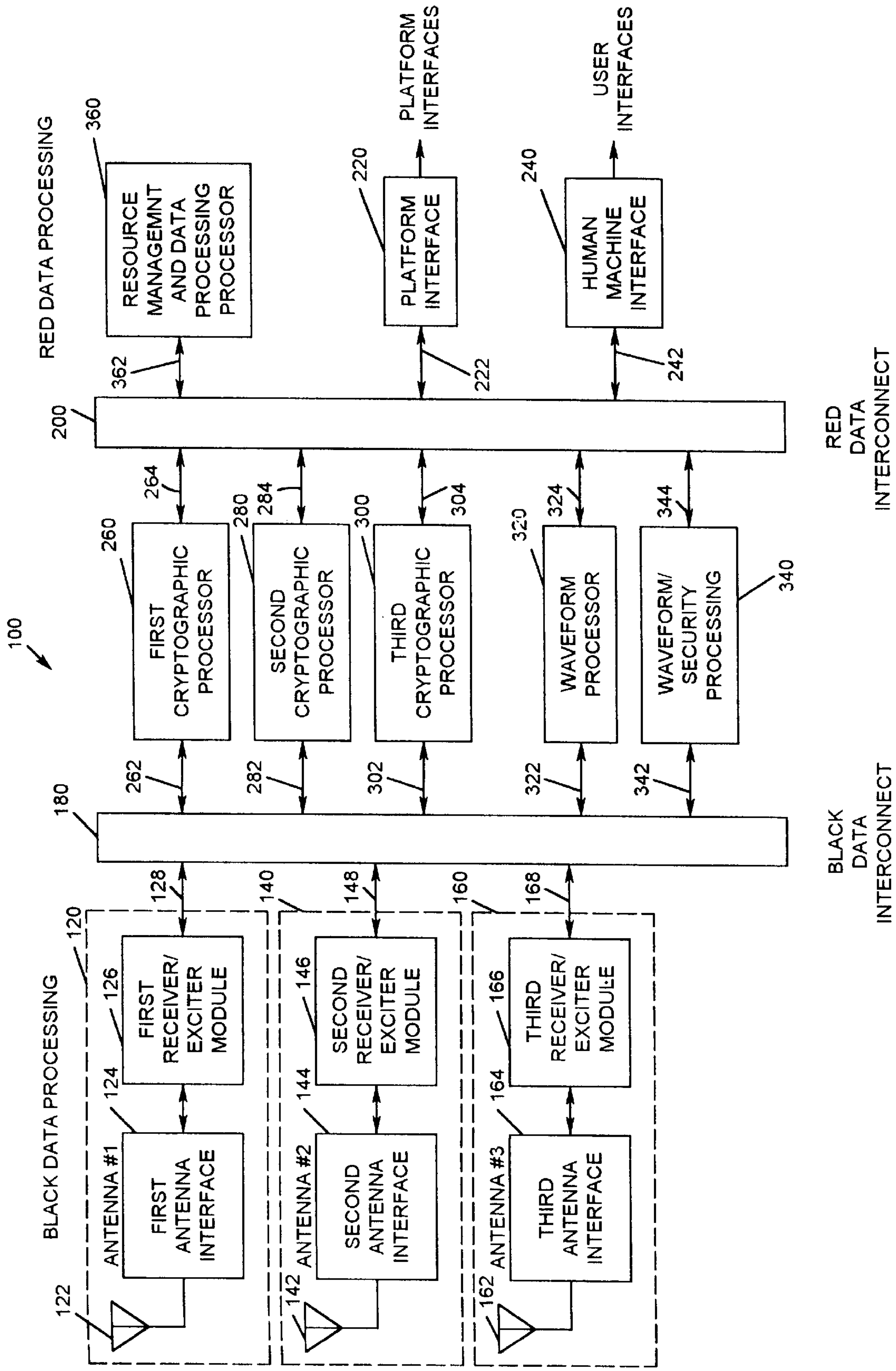
FIG. 1 is a diagrammatic illustration of a CNI avionics system in accordance with preferred embodiments of the present invention.

FIG. 1 is a diagrammatic illustration of CNI avionics system 100 in accordance with preferred embodiments of the present invention. System 100 is an open system having a modular architecture interconnected within an enclosure which provides mechanical and electrical interfaces with the rest of the avionics systems on the platform. A primary advantage of CNI avionics system 100 is its reconfigurability through both the ability to update the functions of various modules or various subsystems, as well as through the redefinition of module-to-module communication pathways or threads. To ensure that CNI avionics system 100 is an open system, it incorporates an architecture which facilitates the replacement of specific subsystems with no or little impact on the functions of other subsystems.

Three primary aspects to the architecture of CNI avionics system 100 are the hardware interfaces, the software interfaces and the mechanical interfaces. Proper hardware interface definition ensures that multiple vendors can provide the same modules to the manufacturer or user of system 100. Standard hardware interfaces also allow module vendors to develop replacement products using the latest technology without concern that all necessary interface information is available to that vendor. Software interface standards are necessary to ensure that application programs can be developed by many vendors. The use of a standardized interface layer within the software architecture provides the necessary information for developers of application programs. Another aspect of software openness is ensuring that development tools associated with this system are available commercially. Mechanical interface definition is important to the physical aspects of the module. This includes form factor and environmental conditions.

Of primary importance in ensuring the reconfigurability of CNI avionics system 100 is the utilization of proper functional partitioning between the various modules and subsystems. Each module and subsystem of system 100 is substantially functionally independent of other modules and subsystems so that it can be replaced without impacting other areas of system 100. In this manner, processors and processing hardware can be replaced with new technology based upon availability and without modifying application software. Conversely, the application software can be modified without necessitating hardware changes to all modules. Further, sensor modules, cryptographic processors and interface elements can be replaced and/or modified without disturbing the other elements.

CNI avionics system 100 includes integrated sensor subsystem 120, integrated sensor subsystem 140, integrated sensor subsystem 160, first (black) data interconnect 180, second (red) data interconnect 200, platform interface 220, human machine interface 240, first cryptographic processor 260, second cryptographic processor 280, third cryptographic processor 300, waveform processor 320, waveform/security processor 340, and resource management processor 360. Each of integrated sensor subsystems 120, 140 and 160 is electrically connectable to interconnect 180 via connections 128, 148 and 168, respectively. First cryptographic processor 260, second cryptographic processor 280 and third cryptographic processor 300 are coupled to first interconnect 180 via connections 262, 282 and 302, respectively. Waveform processor 320 and waveform/security processor 340 are coupled to interconnect 180 via connections 322 and 342, respectively. First cryptographic processor 260, second cryptographic processor 280 and third cryptographic processor 300 are coupled to second interconnect 200 via connections 264, 284 and 304, respectively. Waveform processor 320 and waveform/security processor 340 are coupled to interconnect 200 via connections 324 and 344, respectively. Resource management processor 360, platform interface 220 and human machine interface 240 are electrically coupled to interconnect 200 via connections 362, 222 and 242, respectively.

Each of integrated sensor subsystems 120, 140 and 160 includes a number of modules such as a receiver/exciter module, an antenna and an antenna interface. For example, integrated sensor subsystem 120 includes antenna 122, first antenna interface 124 and first receiver/exciter module 126. Second integrated sensor subsystem 140 includes second antenna 142, second antenna interface 144 and second receiver/exciter module 146. Third integrated sensor subsystem 160 includes third antenna 162, third antenna interface 164 and third receiver/exciter module 166. Although not illustrated in FIG. 1, more than three integrated sensor subsystems can be included in CNI avionics system 100.

Each of integrated sensor subsystems 120, 140 and 160 performs a different CNI related function such as VHF radio communications, UHF radio communications, data link communications, transponders functions and integrated landing system (ILS) functions. The various functions performed by the individual integrated sensor subsystems can be assigned priorities relative to one another. Implementation of CNI waveforms requires the reception and transmission of electromagnetic energy through antennas 122, 142 and 162. Modulation and/or demodulation functions are required for each function performed by one of subsystems 120, 140 and 160. Preferably, the hardware in each of subsystems 120, 140 and 160 is similar or identical so that system 100 benefits from economies of scale and a reduced number of unique modules or subsystems. Thus, the particular function performed by any one of subsystems 120, 140 and 160 is reconfigurable by changing or updating the software which controls the operation of the particular subsystem.

The capability of reassigning functions between modules or subsystems increases the availability of CNI system 100 in the event of a failure of one of the modules or subsystems which performs a higher priority function. Direct conversion receiver (DCR) technology of the type described in detail in U.S. Pat. Nos. 5,095,533, 5,095,536, 5,179,730, 5,230,099 and 5,249,099 and assigned to Rockwell International Corporation can be used to facilitate the previously described reconfigurability. By utilizing DCR technology, avionics system 100 realizes reconfigurability advantages not available in traditional CNI avionics systems which use specialized subsystems or modules (receivers) dedicated to portions of the frequency spectrum using super heterodyne techniques. In order to provide more affordable receivers, alternate approaches in technologies can be employed. The DCR technology described in the previously mentioned patents mixes modulated signals directly to a baseband level. Thus, one subsystem can provide coverage over the 30–2000 MHz frequency range, thereby performing as a wide coverage digital receiver. Since using DCR technology allows each subsystem to operate over a broader frequency range than is necessary for its primary individual function, reconfiguration of the subsystems to perform other functions at other frequencies is more easily achieved. Direct conversion technology receivers introduce the potential for dramatic savings in the cost and size of conventional receivers by replacing much of the unique radio frequency (RF) circuitry with digital components used widely in commercial products.

First cryptographic processor 260, second cryptographic processor 180 and third cryptographic processor 300 are microprocessors or other electronic devices for implementing an encryption/decoding program on data transferred between interconnects 180 and 200. Black data from one of the subsystems is received via interconnect 180, decoded into the red data format, and provided via interconnect 200 to one of platform interfaces 220 and 240. Similarly, red data from any of modules or subsystems 205, 220, 240 or 260 is provided via interconnect 200 to a corresponding cryptographic processor for encryption into the black data format for transfer via interconnect 180 to one of the subsystems.

Waveform processor 320 is a microprocessor or other electronic device for performing specialized process or correlation functions for processes that require close coupling between red and black data signals. Waveform/security processor 340 is preferably a microprocessor or other electronic device programmed to monitor data communications throughout CNI avionics system 100 to ensure data integrity is maintained. As such, processor 340 has access to each of data interconnects 180 and 200, but does not itself process data transmitted between interconnects 180 and 200. Processors 320 and 340 can be digital signal processors such as the processor available from Texas Instruments under the Product No. 320C31.

Processing in a modular avionics system covers a wide variety of functions ranging from general tasks such as asset management and status reporting to time critical processing associated with waveform signal modulation and demodulation. Conventional avionics systems utilize hardware optimized for one task. However, for the architecture of the CNI avionics system of the present invention, utilizing technology capable of performing a wide variety of processing tasks is highly beneficial in reducing costs and increasing reconfigurability. Therefore, the processors and controllers of CNI avionics system 100 preferably utilize currently developing processors capable of performing both general processing and digital signal processing (DSP) tasks. This can be a single common processor capable of performing general purpose or DSP functions. In this case, the DSP architecture is based on Reduced Instruction Set Computer (RISC) design principles, with the RISC instruction set extended to accelerated inner loops of DSP algorithms, thus maintaining a simple architecture. In the alternative, this can be two separate processors incorporated into a single device. By combining a 486-based or more advanced microprocessor host with a DSP coprocessor, functions such as system management and control and upper-level communications protocol can be performed by the host while signal processing functions such as audio compression or lower-level communications processing can be performed by the DSP coprocessor.

Platform interface 220 is a data bus which couples interconnect 200 to other computer or processing devices in CNI avionics system 100. Human machine interface 240 is a module that converts data from interconnect 200 into an appropriate signal (e.g., audio, video, control) for use by the human operator.

Black data interconnect 180 and red data interconnect 200 are data buses which facilitate data transfers. All modules or subsystems arbitrate to communicate on the data buses, preferably according to standard IEEE-1394. However, other interconnect standards can be used instead. Since the hardware interface is of primary concern in the open system architecture of the present invention, the technologies used to implement interconnects 180 and 200 are of particular importance. Preferably, interconnects 180 and 200 are implemented using any of a variety of newly developing high bandwidth interconnect technologies developed for use in local area networks and interprocessor communications. These technologies are available at low cost and provide benefits of the latest technology.

Interconnects 180 and 200 must be controllable to support real time deterministic data transfers. In other words, exact predictions must be made of the order and delivery time of data transfers. Also, they should be isochronous and thus adapted for receiving and transmitting data repetitively at a regular predetermined interval. The isochronous communications are used for digitized audio and video signals. Interconnects 180 and 200 should also be adapted to support asynchronous communications for control or status related communications. Interconnects 180 and 200 should have a band width of 1 MB/sec for voice communication paths, and between 4 and 6 MB/sec for compressed digitized video (500 or more MB/sec for high quality video) communication paths. An important feature of the architecture of CNI avionics system 100 of the present invention is that, for all but the most specialized of signals, intra-module communications must be conducted via interconnect 180 and/or interconnect 200. Using this method of intra-module communication insures that modules can be easily upgraded without redesigning the communication paths needed for communication with the upgraded module.

Resource management processor 360 is a controller programmed to assign communication paths and module functions to various modules of system 100. Resource management processor 360 includes a data base which can be used both to reassign/redefine communication threads or paths to higher priority modules in the event of a communication path failure, and to reprogram lower priority subsystems to perform higher priority functions in the event of failure of a high priority subsystem.

Figure 2:
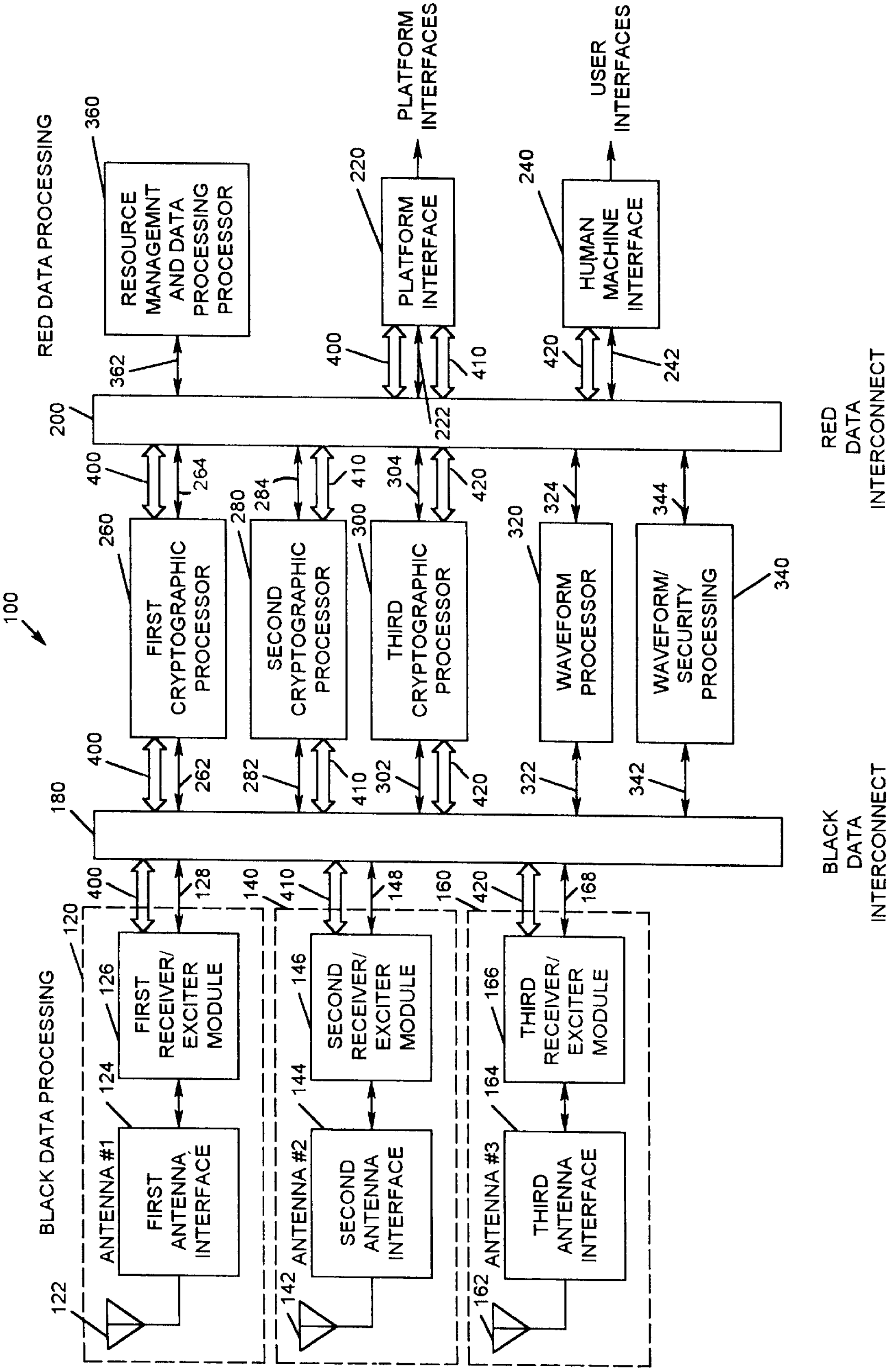
FIG. 2 is a diagrammatic view of the CNI avionics system illustrated in FIG. 1, which further illustrates communication threads or pathways between black data processing integrated sensor subsystems and red data processing modules.

FIG. 2 is a diagrammatic illustration of CNI avionics system 100 illustrated in FIG. 1, which further illustrates communication threads or pathways between black data processing modules and red data processing modules. Using the data base stored in the associated memory of resource management processor 360, a communication path is defined from each black data module (i.e., integrated sensor subsystems 120, 140 and 160) to the corresponding red data modules or subsystems (i.e., platform interface 220 and human machine interface 240) with which the black data module is to communicate. For example, as illustrated in FIG. 2, communication path 400 is initially defined between integrated sensor subsystem 120 and platform interface 220. As initially defined, communication path 400 includes connection 128, first interconnect 180, connection 262, first cryptographic processor 260, connection 264, second interconnect 200 and connection 222. Data transferred in either direction between subsystem 120 and platform interface 220 will follow communication path 400.

FIG. 2 also illustrates defined communication path 410 between integrated sensor subsystem 140 and platform interface 220, and defined communication path 420 between integrated sensor subsystem 160 and human machine interface 240. As initially defined, communication path 410 includes connection 148, first interconnect 180, connection 282, second cryptographic processor 280, connection 284, second interconnect 200 and connection 222. As initially defined, communication path 420 includes connection 168, first interconnect 180, connection 302, third cryptographic processor 300, connection 304, second interconnect 200 and connection 242.

Of course, it will in some instances be necessary to define multiple communication paths for subsystems or modules so that they can communicate with more than one other subsystems or modules. For example, if subsystem 120 must also communicate with human machine interface 240, a second communication path can be defined for subsystem 120 to facilitate this need. In this instance, the communication path (not shown) between subsystem 120 and human machine interface 240 can be identical to communication path 400, but with connection 242 replacing connection 222.

Figure 3:
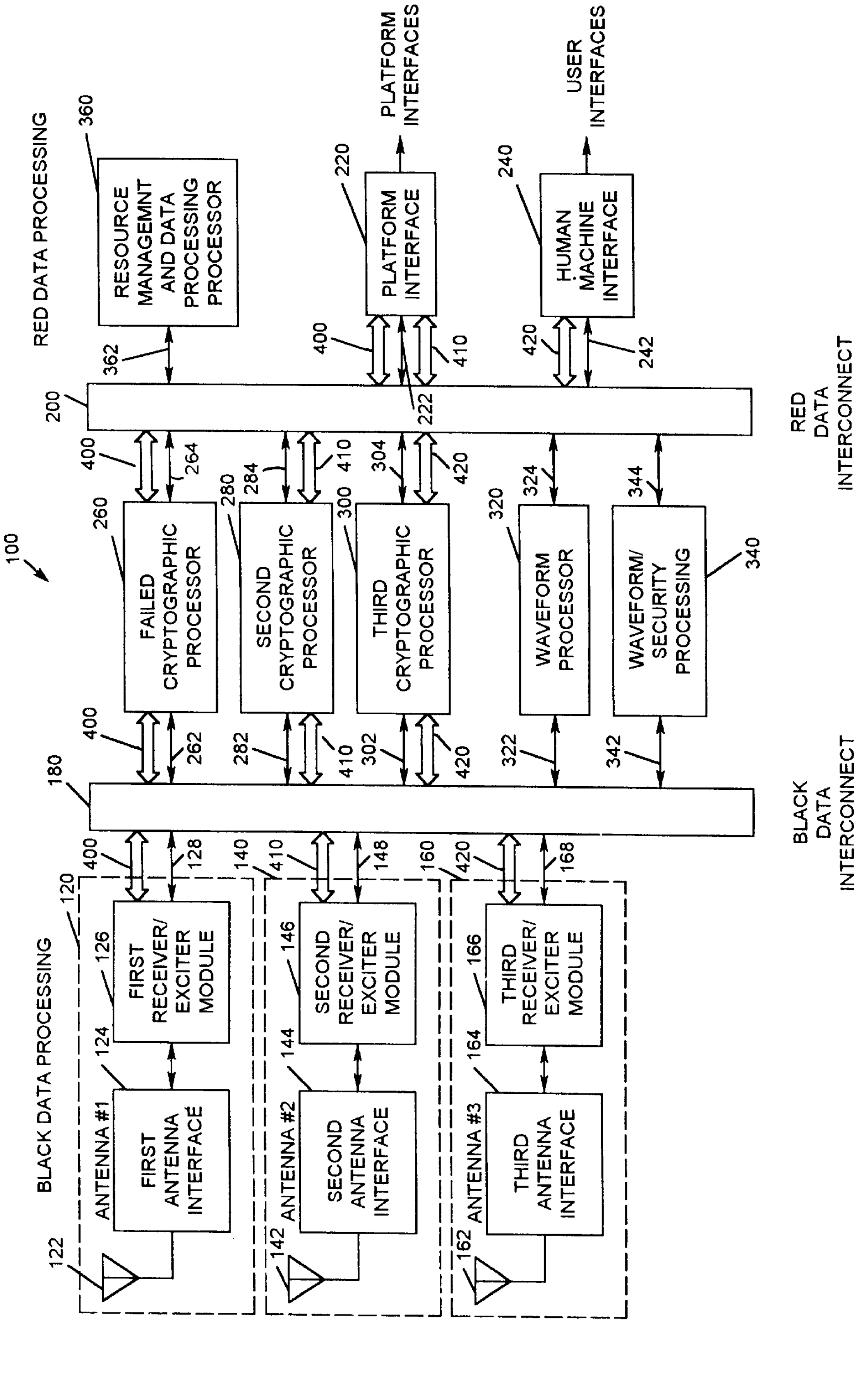
FIG. 3 is a diagrammatic view illustrating the CNI avionics system of FIGS. 1 and 2 in which a cryptographic processor has failed, thus severing one of the defined communication pathways.

FIG. 3 is a diagrammatic view illustrating the CNI avionics system of FIGS. 1 and 2 in which one of the components defining communication path 400 has failed, thus severing communication path 400. In FIG. 3, cryptographic processor 260 is shown as having failed. Because failure of a component or module has eliminated defined communication path 400 between subsystem 120 and platform interface 220, and because there are no unused communication paths available, the corresponding functions related to subsystem 120 are lost. It can be assumed for the purposes of illustration that out of integrated sensor subsystems 120, 140 and 160, the functions performed by subsystem 120 are of the highest priority and the functions performed by subsystem 160 are of the lowest priority. In this instance, without the capability of reconfiguration, the highest priority function of system 100 would be lost while lower priority functions were maintained. Depending upon the nature of the lost function, this could result in a total loss of use of CNI avionics system 100.

Figure 4:
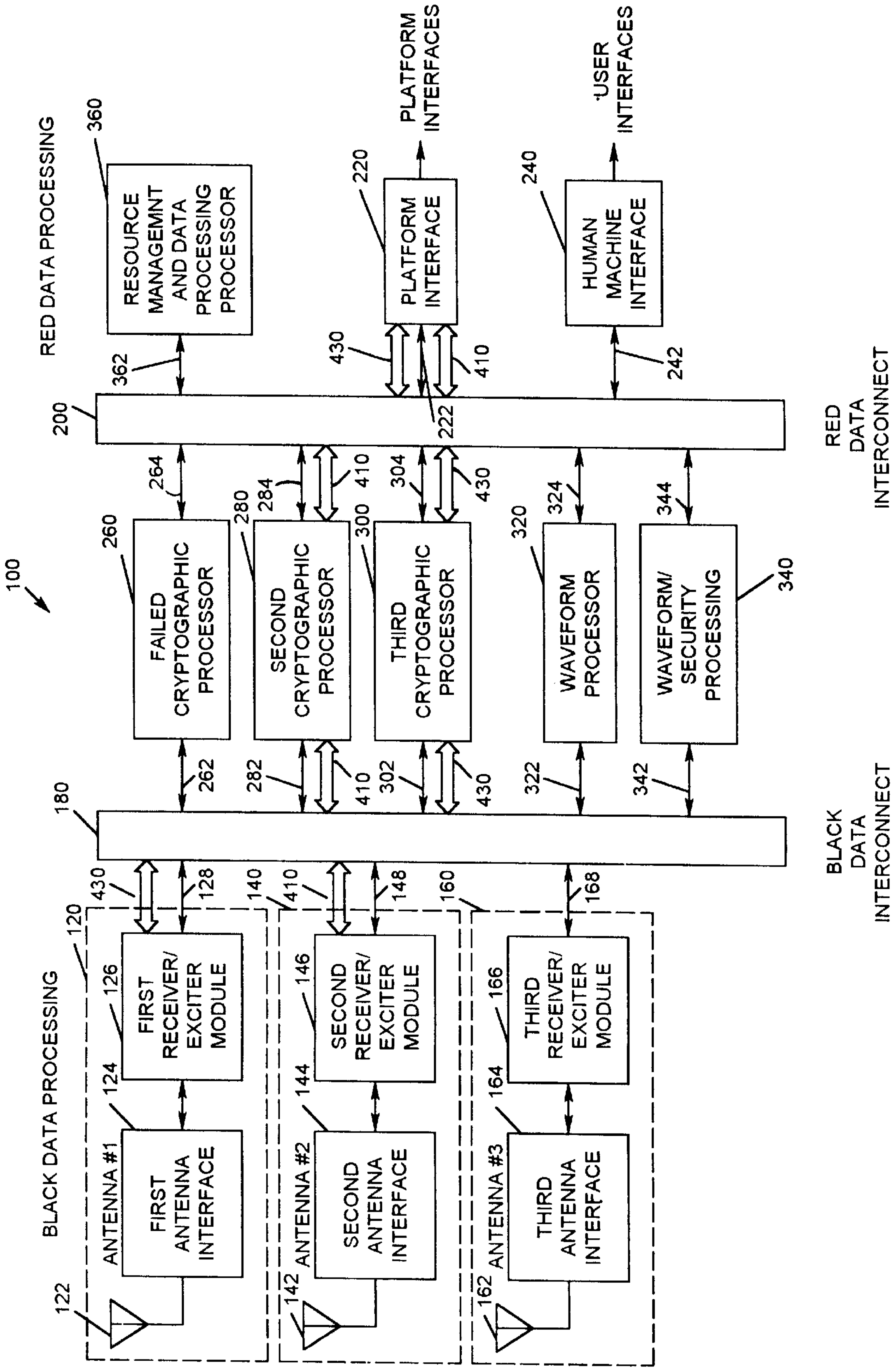
FIG. 4 is a diagrammatic view of the CNI avionics system illustrated in FIGS. 1–3, which further illustrates the manner in which the communication pathways are redefined or reconfigured in order to maintain the higher priority functions of certain integrated sensor subsystems.

FIG. 4 is a diagrammatic view of CNI avionics system 100, which illustrates the manner in which the communication paths are reconfigured in order to maintain the higher priority functions of certain modules. Based upon priorities established prior to the use of CNI avionics system 100, resource management processor 360 determines which functions will be provided by the system after the loss of communication path 400 (for example, as a result of the failure of cryptographic processor 260). Since system 100 can perform only two of the three illustrated functions due to the loss of the cryptographic processor or other assets, resource management processor 360 redefines the communication paths. Since the functions performed by subsystem 120 have been previously determined or defined to be of a higher priority than the functions performed by subsystem 160, resource management processor 360 defines new communication path 430 between subsystem 120 and platform interface 220 by reassigning third cryptographic processor 300. New communication path 430 includes connection 128, first interconnect 180, connection 302, third cryptographic processor 300, connection 304, second interconnect 200, and connection 222. By defining new communication path 430, the high priority function performed by subsystem 120 is preserved at the expense of the lower priority function performed by subsystem 160.

Although the present invention has been described with reference to preferred embodiments, workers skilled in the art will recognize that changes may be made in form and detail without departing from the spirit and scope of the invention.

What is claimed is:

1. A communications, navigation and identification (CNI) avionics system comprising:

a first integrated sensor performing a first CNI function;

a second integrated sensor performing a second CNI function, wherein the first CNI function has a priority higher than a priority of the second CNI function;

a first interconnect coupled to each of the first integrated sensor and the second integrated sensor, the first interconnect carrying signals to and from the first and second integrated sensors;

a plurality of system assets;

a second interconnect coupled to each of the plurality of system assets, the second interconnect carrying signals to and from the plurality of system assets;

a first communication thread coupling and carrying signals between the first integrated sensor and a corresponding one of the plurality of system assets, wherein the first communication thread includes the first interconnect, a first cryptographic processor and the second interconnect;

a second communication thread coupling and carrying signals between the second integrated sensor and a corresponding one of the plurality of system assets, wherein the second communication thread includes the first interconnect, a second cryptographic processor and the second interconnect; and means for automatically reassigning the second cryptographic processor to the first communication thread if the first cryptographic processor malfunctions such that the first CNI function having a previously assigned higher priority than the second CNI function is still performed.

2. The CNI avionics system of claim 1, wherein the means for reassigning the second cryptographic processor comprises a resource management controller coupled to one of the first and second interconnects.

3. The CNI avionics system of claim 2, wherein the resource management controller has a data base stored in associated memory, the data base including communication thread definition information for use in reassigning the second cryptographic processor to the first integrated sensor if the first cryptographic processor malfunctions.

4. The CNI avionics system of claim 2, wherein the first and second integrated sensors include reconfigurable direct conversion receivers.

5. The CNI avionics system of claim 4, wherein the resource management controller further includes means for reprogramming the second integrated sensor to perform the first CNI function if the first integrated sensor malfunctions so that the higher priority first CNI function is still performed.

6. The CNI avionics system of claim 5, wherein the first interconnect is coupled to the second interconnect through the first and second cryptographic processors such that signals transferred from the first integrated sensor to the corresponding one of the plurality of system assets are placed on the first interconnect, decoded by the first cryptographic processor and placed in a decoded format on the second interconnect, and such that signals transferred from the second integrated sensor to the corresponding one of the plurality of system assets are placed on the first interconnect, decoded by the second cryptographic processor and placed in a decoded format on the second interconnect.

7. The CNI avionics system of claim 6, wherein the plurality of system assets includes a platform interface coupling the second interconnect to other CNI avionics system modules.

8. The CNI avionics system of claim 7, wherein the plurality of system assets includes a human machine interface module which converts data into a signal for use by a human operator.

9. The CNI avionics system of claim 8, wherein the first and second CNI functions are functions selected from a group of CNI functions comprising VHF radio communication functions, UHF radio communication functions, data link communication functions, transponder functions and integrated landing system functions.

10. A communications, navigation and identification (CNI) avionics system comprising:

a first plurality of direct conversion receivers (DCRs) each programmed to perform a predetermined CNI function, wherein the predetermined CNI function performed by each of the first plurality of DCRs has a priority assigned thereto relative to priorities assigned to the predetermined CNI functions performed by the other of the first plurality of DCRs;

a second plurality of modules each performing a predetermined function;

a plurality of communications paths, wherein each of the plurality of communication paths is assigned to a corresponding one of the first plurality of DCRs such that it carries signals between the corresponding one of the first plurality of DCRs and a corresponding one of the second plurality of modules, and wherein each of the plurality of communication paths includes a first interconnect, a cryptographic processor and a second interconnect; and a resource management controller coupled to the plurality of communication paths and assigning each of the communication paths to the corresponding ones of the first plurality of DCRs, wherein upon failure of the cryptographic processor assigned to a DCR performing a higher priority function, the resource management controller automatically reassigns to the DCR performing the higher priority function another cryptographic processor selected from one of the plurality of communication paths originally assigned to a DCR performing a lower priority function so that the higher priority CNI function is still performed.

11. The CNI avionics system of claim 10, wherein the resource management controller has a data base stored in associated memory, the data base including communication path definition information for use in reassigning ones of the plurality of communication paths.

12. The CNI avionics system of claim 11, wherein the first plurality of DCRs are reconfigurable DCRs, wherein in the event of a failure of a DCR performing a high priority CNI function, the resource management controller reprograms a DCR originally programmed to perform a lower priority CNI function to perform the high priority CNI function originally performed by the failed DCR.

13. The CNI avionics system of claim 12 wherein the second plurality of modules includes a platform interface coupling the second interconnect to other CNI avionics system modules.

14. The CNI avionics system of claim 13, wherein the second plurality of modules includes a human machine interface module which converts data into a signal for use by a human operator.

15. The CNI avionics system of claim 14, wherein the predetermined CNI functions performed by the first plurality of DCRs are functions selected from a group of CNI functions comprising VHF radio communication functions, UHF radio communication functions, data link communication functions, transponder functions and integrated landing system functions.

* * * * *